(12) United States Patent
Wu et al.

(10) Patent No.: US 12,726,160 B2
(45) Date of Patent: Sep. 1, 2026

(54) RF FRONT-END CHIP, RF SWITCH MODULE, AND RF COMMUNICATION DEVICE

(71) Applicant: Hangzhou Geo-chip Technology Co., Ltd., Hangzhou (CN)

(72) Inventors: Ruili Wu, Hangzhou (CN); Yan Li, Hangzhou (CN)

(73) Assignee: Hangzhou Geo-chip Technology Co., Ltd., Hangzhou (CN)

( * ) Notice: Subject to any disclaimer, the term of this patent is extended or adjusted under 35 U.S.C. 154(b) by 374 days.

(21) Appl. No.: 18/453,578

(22) Filed: Aug. 22, 2023

(65) Prior Publication Data

US 2024/0195368 A1 Jun. 13, 2024

(30) Foreign Application Priority Data

Dec. 8, 2022 (CN) ......................... 202211568867.8
Mar. 8, 2023 (CN) ......................... 202310215352.8
Mar. 30, 2023 (CN) ........................ 202320719847.X

(51) Int. Cl.
*H03F 1/14* (2006.01)
*H03F 3/24* (2006.01)
*H03F 1/02* (2006.01)

(52) U.S. Cl.
CPC ........... *H03F 3/245* (2013.01); *H03F 1/0277* (2013.01); *H03F 1/0288* (2013.01); *H03F 2200/451* (2013.01)

(58) Field of Classification Search
CPC .... H03F 3/245; H03F 2200/451; H03F 3/195; H03F 3/72; H03F 1/14; H03F 1/0277; H03G 1/0088
See application file for complete search history.

(56) References Cited

U.S. PATENT DOCUMENTS 9,647,775 B1 * 5/2017 Tsutsui .................... H03F 3/195
2015/0188536 A1 7/2015 Tang et al.
2019/0068127 A1 * 2/2019 Ishikawa ................ H03F 3/195
2019/0123696 A1 4/2019 Liu et al.

FOREIGN PATENT DOCUMENTS

CN 102610595 A 7/2012
CN 103401531 A 11/2013
CN 103580610 A 2/2014
CN 105281680 A 1/2016
CN 106803747 A 6/2017
CN 109787569 A 5/2019
CN 110121131 A 8/2019
CN 111884642 A 11/2020
CN 114337559 A 4/2022
CN 217282884 U 8/2022

* cited by examiner

*Primary Examiner* — Khanh V Nguyen
(74) *Attorney, Agent, or Firm* — Dority & Manning, PA

(57) ABSTRACT

The present disclosure provides an RF front-end chip, an RF switch module, and an RF communication device. The RF front-end chip includes a logic control circuit, a switching circuit, and an amplifier module assembly that are integrated onto an integrated circuit die, where the logic control circuit is connected to the switching circuit and configured to control the switching circuit, and the switching circuit is integrated into the amplifier module assembly and precedes one or more amplifiers of the amplifier module assembly. By utilizing the RF front-end chip, the integration level of the chip can be improved, and the cost of the chip can be reduced.

19 Claims, 14 Drawing Sheets

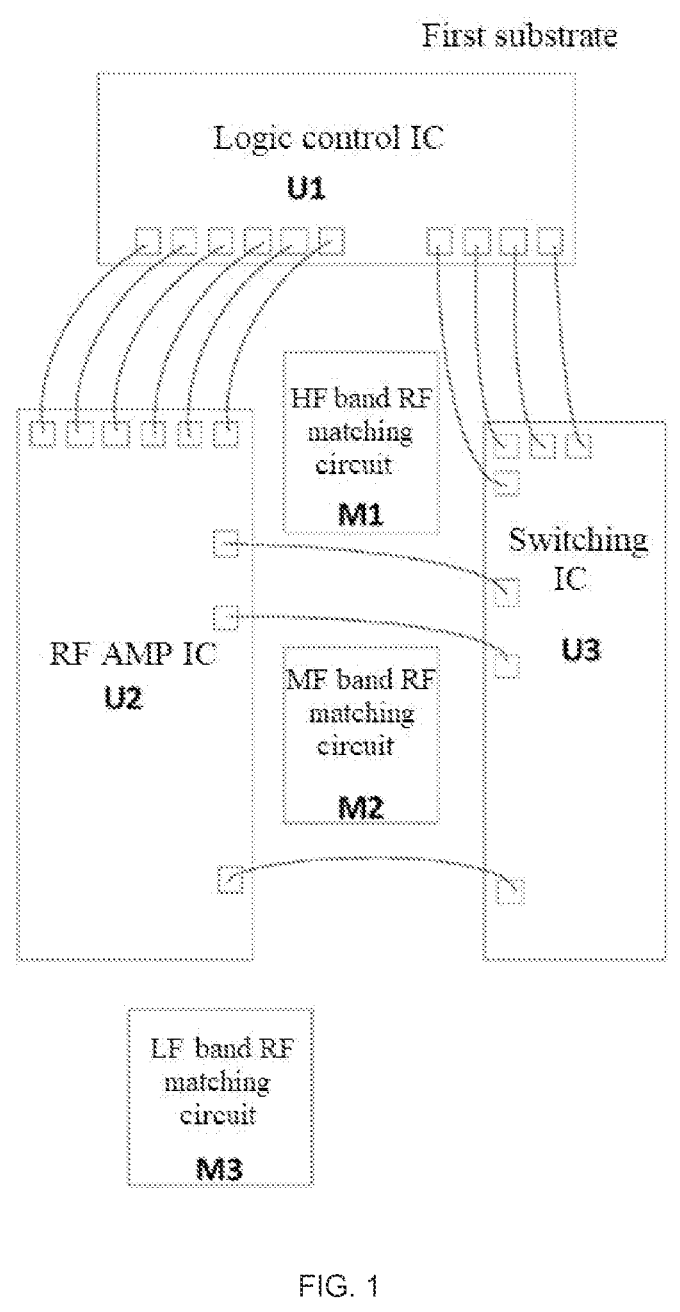

First substrate

Logic control IC
U1

HF band RF matching circuit
M1

Switching IC
U3

RF AMP IC
U2

MF band RF matching circuit
M2

LF band RF matching circuit
M3

FIG. 1

RF FRONT-END CHIP, RF SWITCH MODULE, AND RF COMMUNICATION DEVICE

CROSS-REFERENCE TO RELATED PATENT APPLICATIONS

The present disclosure claims the benefits of and priorities to Chinese Patent Application No. 202211568867.8 filed on Dec. 8, 2022, Chinese Patent Application No. 202310215352.8 filed on Mar. 8, 2023, and Chinese Patent Application No. 202320719847.X filed on Mar. 30, 2023, the entire disclosures of which are incorporated by reference herein.

TECHNICAL FIELD

The present disclosure relates to the field of communication, in particular relates to an RF (Radio Frequency) front-end chip, an RF switch module, and an RF communication device.

BACKGROUND

This part is intended to provide background or context for embodiments of the present disclosure as set forth in claims. The description herein is not admitted to be prior art merely by virtue of its inclusion in this part.

In an existing RF signal amplification module assembly, an amplification chip, a switch chip and a control chip are generally integrated onto a substrate, where the RF signal amplification function is achieved by designing the positional and connection relationships between the amplification chip, the switch chip and the control chip.

However, especially as the expensive gallium arsenide (GaAs) material becomes the mainstream chip material for the third-generation semiconductors, the existing RF signal amplification module assembly designed by integrating the amplification chip, the switch chip and the control chip onto the substrate tends to be bulky with a low integration level and high cost.

In addition, switch modules are widely used in the design (e.g., switch chips or switching circuit) of wireless communication devices, and are applicable to various scenarios that require effective control on passing an RF transmission signal therethrough or blocking it. For example, a switch module may be used in conjunction with an RF front-end module in an RF path which may further include a baseband module, an RF transceiving module, and an antenna.

In an existing RF path, a rather bulky connection circuit is typically formed when integrating the RF front-end module with the RF switch module located downstream thereof, especially in the case of a CMOS process combined with a gallium arsenide (GaAs) process. More typically, in the case of Multiple Input Multiple Output (MIMO), the circuit has a rather low integration level and a rather high manufacturing cost.

SUMMARY

In view of the problems in the prior art, the present disclosure proposes an RF front-end chip, an RF switch module and an RF communication device, to solve the aforesaid problems by utilizing the RF front-end chip, the RF switch module and the RF communication device.

The present disclosure provides following solutions.

In a first aspect, an RF front-end chip is provided. The RF front-end chip includes a logic control circuit, a switching circuit, and an amplifier module assembly that are integrated onto an integrated circuit die (DIE), where the logic control circuit is connected to the switching circuit and configured to control the switching circuit, and the switching circuit is integrated into the amplifier module assembly and precedes one or more amplifiers of the amplifier module assembly.

In some embodiments, the amplifier module assembly includes an amplifier module corresponding to a preset frequency band; and the switching circuit includes a sub-switch circuit corresponding to the preset frequency band, where the sub-switch circuit for the preset frequency band is integrated into the amplifier module for the preset frequency band.

In some embodiments, the amplifier module corresponding to the preset frequency band includes two or more branches provided in parallel, each branch being provided with one or more amplifiers; and the sub-switch circuit corresponding to the preset frequency band includes a switch unit integrated in said each branch and preceding the one or more amplifiers.

In some embodiments, the amplifier module assembly includes a low-frequency amplification module, a mid-frequency amplification module and a high-frequency amplification module; and the switching circuit includes one or more sub-switch circuits that are integrated into one or more selected from the low-frequency amplification module, the mid-frequency amplification module and the high-frequency amplification module respectively.

In some embodiments, the low-frequency amplification module includes a first switch unit and a first amplifier unit, where the first switch unit precedes the first amplifier unit; the mid-frequency amplification module includes a first-stage amplification unit, a second switch unit and a second-stage amplification unit, where the second switch unit is provided between the first-stage amplification unit and the second-stage amplification unit; and the high-frequency amplification module includes a second amplifier unit.

In some embodiments, the first switch unit has a first terminal configured to receive a low-frequency band RF signal, a second terminal electrically connected to an input terminal of the first amplifier unit, and a control terminal connected to the logic control circuit.

In some embodiments, the first switch unit includes a first switch and a second switch, the first amplifier unit includes a first branched amplifier and a second branched amplifier, where the first switch and the second switch have respective input terminals each configured to receive a low-frequency band RF signal, with an output terminal of the first switch being electrically connected to the first branched amplifier and an output terminal of the second switch being electrically connected to the second branched amplifier.

In some embodiments, the first branched amplifier includes a first amplifier and a second amplifier, and the second branched amplifier includes a third amplifier and a fourth amplifier, where the first amplifier has an input terminal electrically connected to the output terminal of the first switch, and an output terminal electrically connected to an input terminal of the second amplifier, with an output terminal of the second amplifier being configured to output an amplified low-frequency band RF signal; and the third amplifier has an input terminal electrically connected to the output terminal of the second switch, and an output terminal electrically connected to an input terminal of the fourth amplifier, with an output terminal of the fourth amplifier being configured to output an amplified low-frequency band RF signal.

In some embodiments, the first-stage amplification unit has an input terminal configured to receive a mid-frequency band RF signal, and an output terminal electrically connected to the second-stage amplification unit via the second switch unit, with a control terminal of the second switch unit being configured to receive a second control signal.

In some embodiments, the second switch unit includes a third switch, a fourth switch and a fifth switch, and the second-stage amplification unit includes a third branched amplifier, a fourth branched amplifier and a fifth branched amplifier, where the third switch, the fourth switch and the fifth switch have respective input terminals each connected to the output terminal of the first-stage amplification unit, and respective output terminals electrically connected to the third branched amplifier, the fourth branched amplifier and the fifth branched amplifier respectively.

In some embodiments, the third branched amplifier includes a fifth amplifier, the fourth branched amplifier includes a sixth amplifier, the fifth branched amplifier includes a seventh amplifier, and the first-stage amplification unit includes an eighth amplifier.

In some embodiments, the second amplifier unit includes a ninth amplifier and a tenth amplifier, where the ninth amplifier has an input terminal configured to receive a high-frequency band RF signal, and an output terminal electrically connected to an input terminal of the tenth amplifier, with an output terminal of the tenth amplifier being configured to output an amplified high-frequency band RF signal.

In some embodiments, the RF front-end chip is a CMOS integrated chip.

In some embodiments, the RF front-end chip is packaged by a FC-LGA flip-chip process.

In another aspect, there is provided a circuit structure including the RF front-end chip according to the first aspect.

In still another aspect, there is provided an RF communication device that includes the RF front-end chip according to the first aspect.

One of the advantages of aforesaid embodiments is that the RF chip designed by integrating the logic control circuit, the switching circuit and the amplifier module assembly of the RF front-end chip together can achieve an improved integration level and thus a small volume and compact structure while ensuring the RF signal amplification function.

In yet still another aspect, an RF switch module is provided. The RF switch module is configured to be applicable to a circuit or chip for power amplification (PA), for example applicable to the aforesaid RF front-end chip.

The RF switch module includes at least two branches provided in parallel, each branch of the at least two branches including a switch assembly configured to connect or disconnect said each branch including the switch assembly based on a received logic control signal, wherein said each branch further includes an amplifier provided downstream of the switch assembly.

In some embodiments, the switch assembly includes a series circuit equivalent to a first assembly including a series transistor, a first resistor, a second resistor and a third resistor, the series transistor having a gate configured to receive a first bias voltage input via the first resistor, and a source and a drain with the third resistor provided therebetween, where the drain is further connected to the amplifier. Since the switch assembly utilizes the series circuit, the series circuit enables a smaller on-resistance compared to the conventional switch assembly.

In some embodiments, the series transistor has a substrate configured to receive a first body voltage input via the second resistor.

In some embodiments, the switch assembly includes a parallel circuit equivalent to a second assembly including a parallel field-effect tube (FET), a fourth resistor, a fifth resistor and a sixth resistor, the parallel field-effect tube having a gate configured to receive a second bias voltage input via the fourth resistor, and a source and a drain with the sixth resistor provided therebetween. Since the switch assembly utilizes a parallel circuit, the parallel circuit enables a higher power carrying capacity compared to the conventional switch assembly.

In some embodiments, the parallel field-effect tube has a substrate configured to receive a second body voltage input via the fifth resistor.

In yet still another aspect, there is provided an RF front-end chip including the aforesaid RF switch module and a power amplifier module provided downstream of the RF switch module.

In yet still another aspect, there is provided a transmitter including the aforesaid RF front-end chip.

In yet still another aspect, there is provided a transceiver including the aforesaid transmitter.

In yet still another aspect, there is provided a signal processing apparatus, such as an RF communication device, which includes the aforesaid transceiver.

In yet still another aspect, an RF switch module is provided. The RF switch module is configured to be applicable to amplification of an RF signal and for example applicable to an RF front-end chip.

The RF switch module includes a first branch, a second branch and a third branch that are arranged in parallel, where each branch of the first branch, the second branch and the third branch includes a switch configured to connect or disconnect said each branch including the switch based on a received logic control signal.

In some embodiments, switches of the first branch, the second branch and the third branch are respectively connected to a first field-effect tube, a second field-effect tube and a third field-effect tube, where the first field-effect tube, the second field-effect tube and the third field-effect tube have respective input terminals each connected to a signal output terminal of a fourth field-effect tube, with a signal input terminal of the fourth field-effect tube being configured to receive an input RF signal, and any one field-effect tube of the first field-effect tube, the second field-effect tube and the third field-effect tube being controlled by a signal transmitted in one of the first branch, the second branch and the third branch that corresponds to said any one field-effect tube.

In some embodiments, the switch is a switching transistor, where said each branch is configured to receive the logic control signal via a control terminal of the switching transistor, and the RF switch module receives an output signal from an output terminal of a first-stage amplifier provided upstream of the RF switch module, and inputs the received output signal to an input terminal of a second-stage amplifier provided downstream of the RF switch module based on the logic control signal.

In some embodiments, said each branch is configured such that the control terminal of the switching transistor receives the logic control signal input via a first resistor, a first signal terminal of the switching transistor receives the output signal input via a first capacitor, and a second signal terminal of the switching transistor transmits the received output signal via a second capacitor.

In some embodiments, said each branch further includes a break unit that enables breaking of said each branch including the break unit, the break unit including a pull-down transistor that enables grounding or ungrounding of said each branch including the break unit based on a pull-down control signal as received.

In some embodiments, the pull-down transistor has a control terminal configured to receive the pull-down control signal input via a second resistor, a first signal terminal that is grounded, and a second signal terminal connected to the input terminal of the second-stage amplifier.

In yet still another aspect, there is provided a power amplification module including a first-stage amplifier, a second-stage amplifier and the aforesaid RF switch module, where the RF switch module is provided between the first-stage amplifier and the second-stage amplifier.

In some embodiments, the second-stage amplifier is configured to input an output signal into an impedance matching network.

In yet still another aspect, there is provided an RF front-end module including the aforesaid power amplification module.

In yet still another aspect, there is provided an RF communication device including the aforesaid RF front-end module.

Other advantages of the present disclosure will be explained in more detail in conjunction with the following description and accompanying drawings.

It should be noted that the aforesaid description is merely an overview of the technical solutions of the present disclosure for facilitating better understanding of technical solutions of the present disclosure and thus implementation thereof in accordance with the content described in the specification. Embodiments of the present disclosure will be given below to make the above and other objects, features, and advantages of the present disclosure more apparent.

BRIEF DESCRIPTION OF THE DRAWINGS

By reading following details of the exemplary embodiments below, those of ordinary skills in the art may understand the advantages and benefits described herein and other advantages and benefits. The accompanying drawings are for the purpose of illustrating exemplary embodiments only and are not intended to be a limitation of the present disclosure. Further, a same reference sign is adopted to indicate a same component throughout the accompanying drawings. In the accompanying drawings:

FIG. 1 is a schematic structural diagram of an RF front-end chip according to the prior art;

Figure 2:
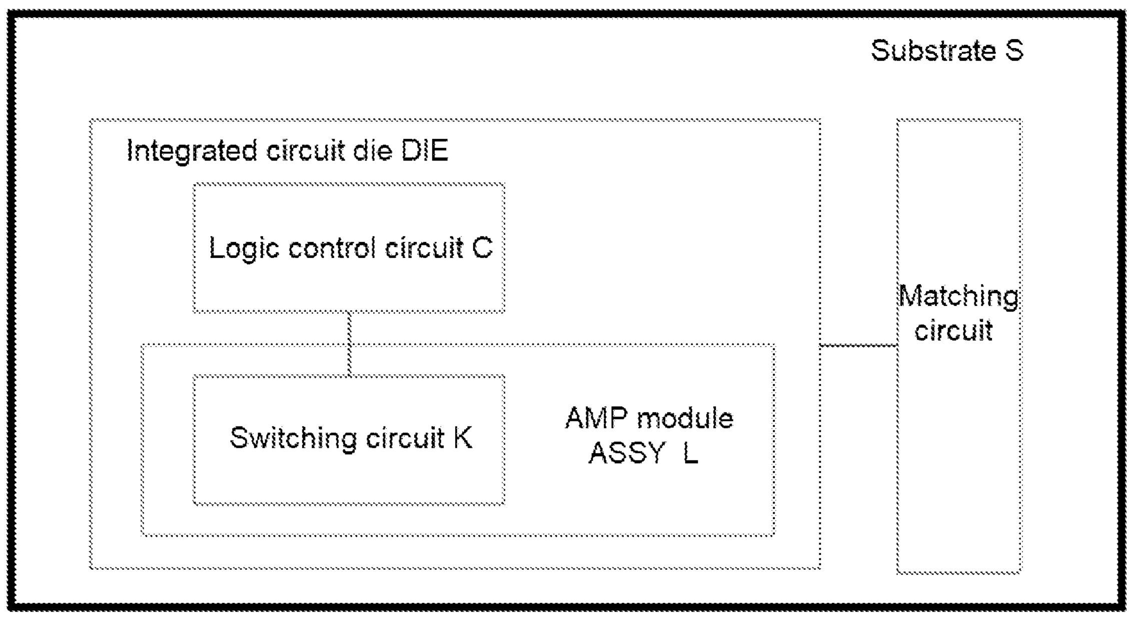
FIG. 2 is a first schematic structural diagram of an RF front-end chip according to some embodiments of the present disclosure.

In the accompanying drawings, the same or corresponding reference signs indicate same or corresponding portions.

DETAILED DESCRIPTION

Exemplary embodiments of the present disclosure will be described below in more detail with reference to the accompanying drawings. Although the accompanying drawings illustrate exemplary embodiments of the present disclosure, it should be understood that the present disclosure can be implemented in various forms and should not be construed as limited to embodiments described herein. Rather, these embodiments are provided so that the present disclosure will be understood thoroughly, and will fully convey the scope of the present disclosure to those skilled in the art.

In description of embodiments of the present disclosure, it should be understood that terms such as "include" or "have" are intended to indicate the existence of the characteristics, digits, steps, actions, components, parts disclosed by the specification or any combination thereof, without excluding the existence of one or more other characteristics, digits, steps, actions, components, parts or any combination thereof.

Unless otherwise specified, "/" refers to "or". For example, A/B may indicate A or B. In this specification, the term "and/or" merely describes the association relationship between the associated objects and indicates that there may be three relationships. For example, A and/or B may indicate three cases where only A exists, both A and B exist, and only B exists.

In addition, the terms such as "first" and "second" are merely for a descriptive purpose, and cannot be understood as indicating or implying a relative importance, or implicitly indicating the number of the indicated technical features. Hence, the features defined by "first" and "second" can explicitly or implicitly include one or more features. In the description of embodiments of the present disclosure, "a plurality of" means two or more in number, unless otherwise stated.

Generally in an existing RF signal amplification module assembly, an amplification chip, a switch chip and a control chip are integrated onto a substrate, where the RF signal amplification function is achieved by designing the positional and connection relationship between the amplification chip, the switch chip and the control chip.

For example, FIG. 1 is a schematic structural diagram of an existing RF front-end chip. The RF front-end chip includes a first substrate, and a logic control IC U1 (e.g. integrated circuit), an RF amplification IC U2 and a switching IC U3 that are disposed on the first substrate. The logic control IC, the RF amplification IC, and the switching IC are connected with each other. The logic control IC is configured to control operations of the RF amplification IC and the switching IC. The RF amplification IC includes a second substrate and a plurality of RF amplification circuits disposed on the second substrate. The switching IC has a plurality of RF signal output terminals corresponding to different sub-frequency bands respectively, and the RF signals as output from the RF amplification IC are output via the RF signal output terminal of the switching IC.

The existing method of forming RF front-end chip by integrating the amplification chip, the switch chip and the control chip all onto the substrate leads to a large footprint of devices in the designed RF front-end chip, which causes the RF front-end chip to be bulky with a low integration level, and leads to a rather large number of devices required for the RF front-end chip, resulting in high cost.

In view of the aforesaid problems, the present disclosure provides an RF front-end chip which, as shown in FIG. 2, includes a logic control circuit C, a switching circuit K, and an amplifier module assembly L. According to embodiments of the present disclosure, the logic control circuit C, the switching circuit K, and the amplifier module assembly L are integrated onto an integrated circuit die (DIE), and the switching circuit K is integrated with the amplifier module assembly L. The logic control circuit C is connected to the switching circuit K to control on/off of the switching circuit K, and the switching circuit K precedes one or more amplifiers of the amplifier module assembly L to adjust the RF amplification function of the amplifier module assembly L. As a result, the designed RF front-end chip is highly integrated with a small volume and compact structure, which can save space for other integrated chips and save device cost by adopting fewer devices.

Further, the integrated circuit die may be integrated with one or more other matching circuits onto a substrate S to achieve its chip function.

As a possible embodiment, the amplifier module assembly L includes an amplifier module corresponding to a preset frequency band. Correspondingly, the switching circuit K may include a sub-switch circuit corresponding to the preset frequency band, where the sub-switch circuit for the preset frequency band is integrated into the amplifier module for the preset frequency band.

Figure 3:
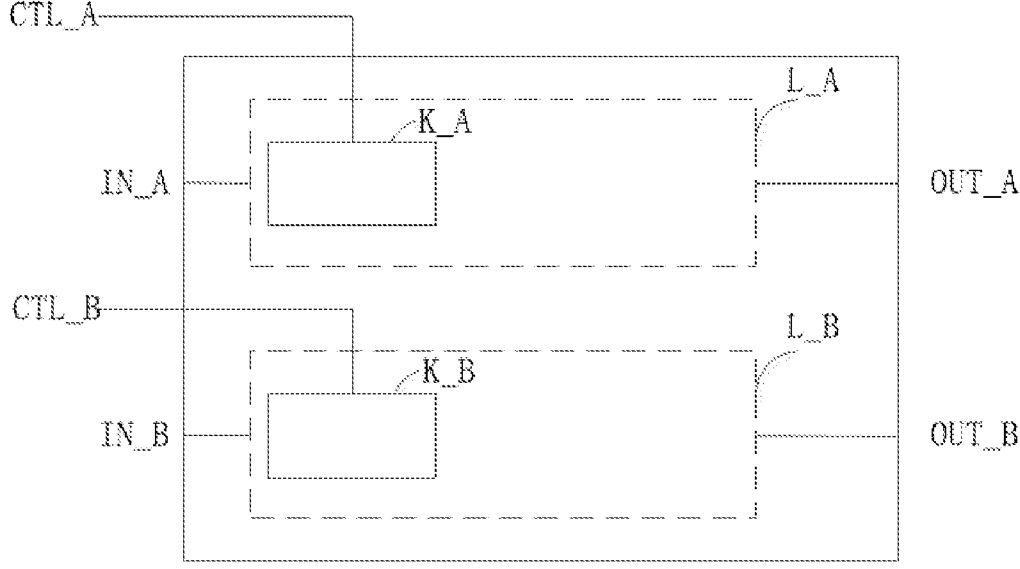
FIG. 3 is a second schematic structural diagram of an RF front-end chip according to some embodiments of the present disclosure.

Referring to FIG. 3, the RF front-end chip according to some embodiments of the present disclosure may be a multi-mode and multi-frequency RF chip. That is, the RF front-end chip may support multi-frequency band and multi-standard RF functions. Assuming that the RF front-end chip supports RF amplification functions for a preset frequency band A and a preset frequency band B, the amplifier module assembly L may include an amplifier module L_A corresponding to the preset frequency band A and an amplifier module L_B corresponding to the preset frequency band B. Accordingly, the switching circuit K may include a sub-switch circuit K_A corresponding to the preset frequency band A, and a sub-switch circuit K_B corresponding to the preset frequency band B. The sub-switch circuit K_A is integrated into the amplifier module L_A, and the sub-switch circuit K_B is integrated into the amplifier module L_B. The amplifier module L_A receives an RF signal IN_A, and the sub-switch circuit K_A controls whether to amplify the received RF signal IN_A by the amplifier module L_A according to a control signal CTL_A received from the logic control circuit C; correspondingly, the sub-switch circuit K_B controls whether to amplify the received RF signal IN_B by the amplifier module L_B according to the control signal CTL_B received from the logic control circuit C.

Optionally, the sub-switch circuit as integrated into the amplifier module corresponding to the preset frequency band may be disposed at any position in the amplifier module, and may for example precede the amplifier unit of the amplifier module or may be arranged between two amplifier units, which is not specifically limited in the present disclosure.

In practice, the communication frequency band is roughly divided into several main frequency bands according to frequency intervals, and may for example be divided into three main frequency bands, which are respectively a low-frequency band, a mid-frequency band and a high-frequency band. The low-frequency band roughly ranges from 700 MHz to 1000 MHz, the mid-frequency band roughly ranges from 1700 MHz to 2200 MHz, and the high-frequency band roughly ranges from 2300 MHz to 2700 MHz. Each main frequency band is further subdivided into a plurality of sub-bands.

Figure 4:
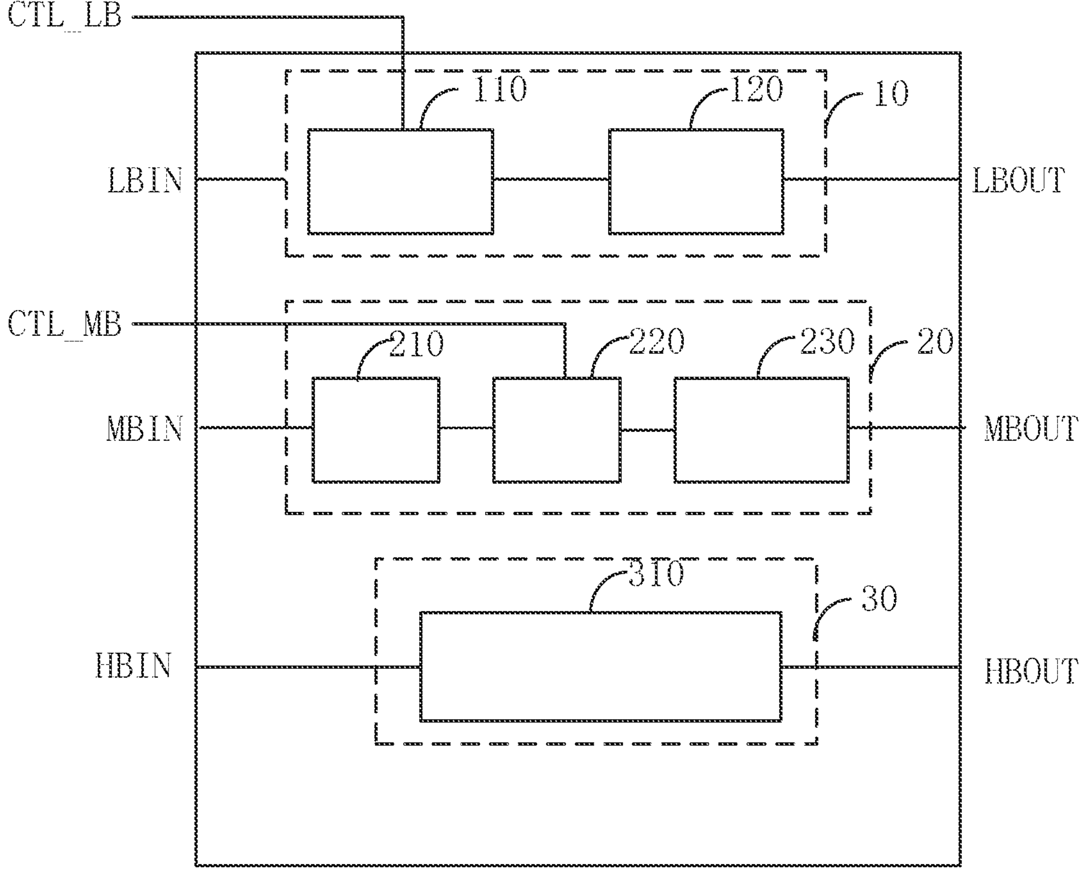
FIG. 4 is a third schematic structural diagram of an RF front-end chip according to some embodiments of the present disclosure.

In a possible embodiment, referring to FIG. 4, the amplifier module assembly L includes a low-frequency amplification module 10, a mid-frequency amplification module 20, and a high-frequency amplification module 30; and the switching circuit K includes one or more sub-switch circuits integrated into one or more of the low-frequency amplification module 10, the mid-frequency amplification module 20, and the high-frequency amplification module 30, respectively.

In a possible embodiment, the low-frequency amplification module 10 includes a first switch unit 110 and a first amplifier unit 120; the mid-frequency amplification module 20 includes a first-stage amplification unit 210, a second switch unit 220, and a second-stage amplification unit 230; and the high-frequency amplification module 30 includes a second amplifier unit 310.

For the RF amplification circuit as designed above, the low-frequency amplification module 10 may receive a low-frequency band RF signal LBIN, and the first switch unit 110 is configured to control whether to amplify the received low-frequency band RF signal LBIN by the first amplifier unit 120 according to the first control signal CTL_LB. For example, when the first control signal CTL_LB received by the first switch unit 110 is a high level signal, the first switch unit 110 is turned on, such that the first amplifier unit 120 amplifies the received low-frequency band RF signal LBIN and outputs the amplified low-frequency band RF signal LBOUT; and when the first control signal CTL_LB received by the first switch unit 110 is a low level signal, the first switch unit 110 is not turned on, such that the first amplifier unit 120 does not amplify the received low-frequency band RF signal LBIN.

The mid-frequency amplification module 20 may receive a mid-frequency band RF signal MBIN, and the second switch unit 220 is configured to control whether to amplify the received mid-frequency band RF signal MBIN by the first-stage amplification unit 210 and the second-stage amplification unit 230 according to the second control signal CTL_MB. For example, when the second control signal CTL_MB received by the second switch unit 220 is a high level signal, the second switch unit 220 is turned on, such that the first-stage amplification unit 210 and the second-stage amplification unit 230 amplify the received mid-frequency band RF signal MBIN and output the amplified mid-frequency band RF signal MBOUT; and when the second control signal CTL_MB received by the second switch unit 220 is a low level signal, the second switch unit 220 is not turned on, such that the first-stage amplification unit 210 and the second-stage amplification unit 230 do not amplify the received mid-frequency band RF signal MBIN.

The second amplifier unit 310 in the high-frequency amplification module 30 is configured to amplify the received high-frequency band RF signal HBIN. The low-frequency band RF signal LBIN, the mid-frequency band RF signal MBIN, and the high-frequency band RF signal HBIN are all RF signals, and their difference lies in the fact that the RF signals of the low-frequency band RF signal, the mid-frequency band RF signal, and the high-frequency band RF signal are of different frequencies for adapting to the transmission requirements of different frequency bands.

In this embodiment, the low-frequency amplification module, the mid-frequency amplification module, and the high-frequency amplification module are integrated together, and a plurality of sub-switch circuits of the switching circuit are respectively integrated into the amplification modules for respective frequency bands, which enables the first switch unit integrated in the low-frequency amplification module to control the amplification of the low-frequency band RF signal, and enables the second switch unit integrated in the mid-frequency amplification module to control the amplification of the mid-frequency band RF signal. As a result, the RF amplification can be controlled, so that the RF front-end chip designed in this solution can not only ensure the RF signal amplification function but also can achieve a high integration level with a small volume and compact structure, thereby saving the space of the RF module for other integrated chips and reducing the cost by adopting fewer devices.

In an optional example of this embodiment, further referring to FIG. 4, the first switch unit 110 in the low-frequency amplification module 10 has a first terminal configured to receive a low-frequency band RF signal LBIN, a second terminal electrically connected to the first amplifier unit 120, and a control terminal configured to receive the first control signal CTL_LB.

The first-stage amplification unit 210 in the mid-frequency amplification module 20 has an input terminal configured to receive the mid-frequency band RF signal MBIN, and an output terminal electrically connected to the second-stage amplification unit 230 via the second switch unit 220, with a control terminal of the second switch unit 220 being configured to receive the second control signal CTL_MB.

In a possible embodiment, the amplifier module corresponding to the preset frequency band includes two or more branches provided in parallel, with each branch being provided with one or more amplifiers; and the sub-switch circuit corresponding to the preset frequency band includes a switch unit integrated in each branch, with the switch unit preceding the one or more amplifiers.

Figure 5:
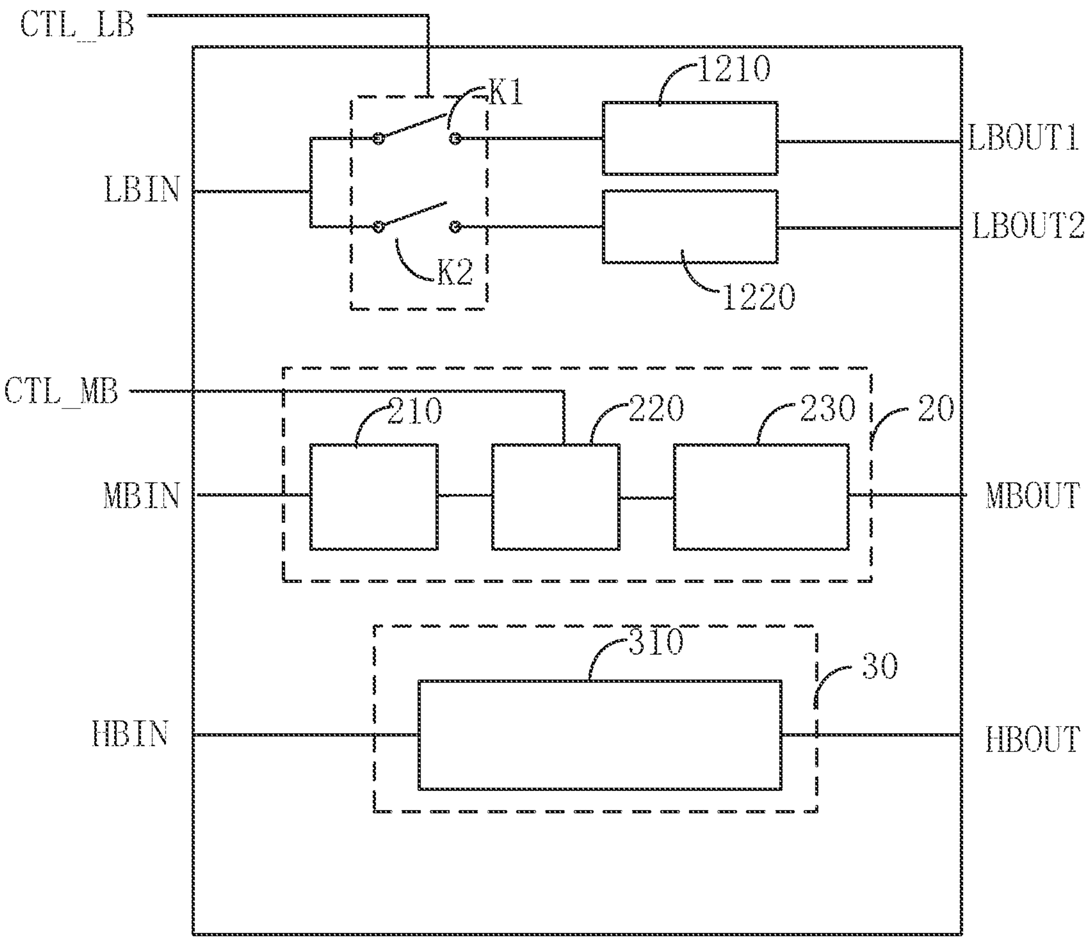
FIG. 5 is a fourth schematic structural diagram of an RF front-end chip according to some embodiments of the present disclosure.

Referring to FIG. 5, in the RF front-end chip according to some embodiments of the present disclosure, the low-frequency amplification module 10 may include two low-frequency band amplification branches. The first branch is provided with a first branched amplifier 1210 and a first switch K1 preceding the first branched amplifier 1210, and the second branch is provided with a second branched amplifier 1220 and a second switch K2 preceding the second branched amplifier 1220. The first switch K1 and the second switch K2 have respective input terminals each configured to receive the low-frequency band RF signal LBIN, respective output terminals electrically connected to the first branched amplifier 1210 and the second branched amplifier 1220 respectively, and respective control terminals each configured to receive the first control signal CTL_LB. As a result, when the first control signal CTL_LB received by the first switch K1 and the second switch K2 is a high level signal, the first switch K1 and the second switch K2 is turned on, such that the low-frequency band RF signal LBIN is transmitted to the first branched amplifier 1210 via the first switch K1 and to the second branched amplifier 1220 via the second switch K2, thereby amplifying the low-frequency band RF signal LBIN by the first branched amplifier 1210 and the second branched amplifier, thus outputting two amplified low-frequency band RF signals LBOUT1 and LBOUT2 respectively.

Figure 6:
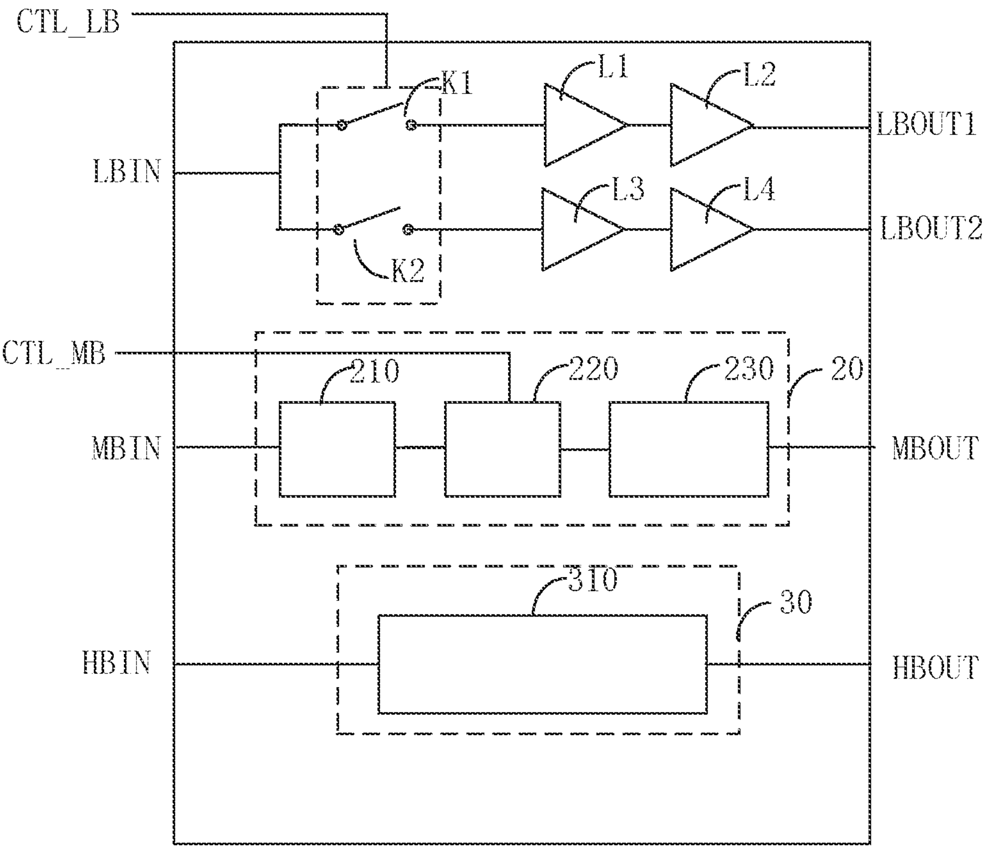
FIG. 6 is a fifth schematic structural diagram of an RF front-end chip according to some embodiments of the present disclosure.

As a possible embodiment, referring to FIG. 6, the first branched amplifier 1210 may include a first amplifier L1 and a second amplifier L2, and the second branched amplifier 1220 may include a third amplifier L3 and a fourth amplifier L4. The output terminal of the first switch K1 is electrically connected to the input terminal of the first amplifier L1, and the output terminal of the first amplifier L1 is electrically connected to the input terminal of the second amplifier L2; and the output terminal of the second switch K2 is electrically connected to the input terminal of the third amplifier L3, and the output terminal of the third amplifier L3 is electrically connected to the input terminal of the fourth amplifier L4.

Figure 7:
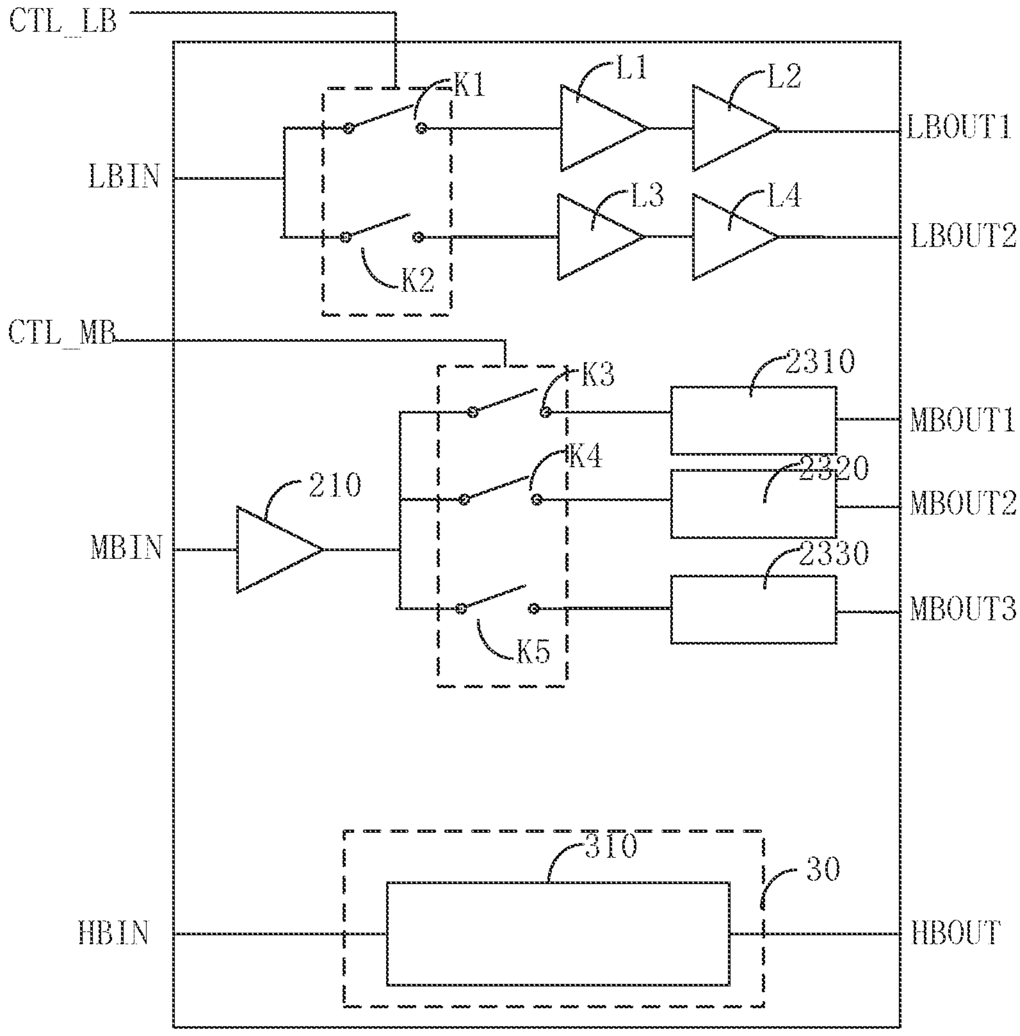
FIG. 7 is a sixth schematic structural diagram of an RF front-end chip according to some embodiments of the present disclosure.

As a possible embodiment, referring to FIG. 7, the second switch unit 220 in the mid-frequency amplification module 20 includes a third switch K3, a fourth switch K4, and a fifth switch K5; and the second-stage amplification unit 230 includes a third branched amplifier 2310, a fourth branched amplifier 2320, and a fifth branched amplifier 2330. The third switch K3, the fourth switch K4, and the fifth switch K5 have respective input terminals each connected to the output terminal of the first-stage amplification unit 210, and respective output terminals electrically connected to the third branched amplifier 2310, the fourth branched amplifier 2320 and the fifth branched amplifier 2330 respectively.

According to the mid-frequency amplification module 20 as designed above, the third switch K3, the fourth switch K4, and the fifth switch K5 have respective control terminals that each can receive the second control signal CTL_MB. Based on the foregoing examples, when the received second control signal CTL_MB is a high level signal, the second control signal CTL_MB received by the second switch module 220 enables one of the third switch K3, the fourth switch K4, and the fifth switch K5 to be turned on, such that one of the branched amplifiers corresponding to the turned-on switch is enabled to amplify the mid-frequency band RF signal MBIN to output the amplified mid-frequency band RF signal, such as outputting an amplified signal of one of MBOUT1, MBOUT2, and MBOUT3 as shown in FIG. 7.

Figure 8:
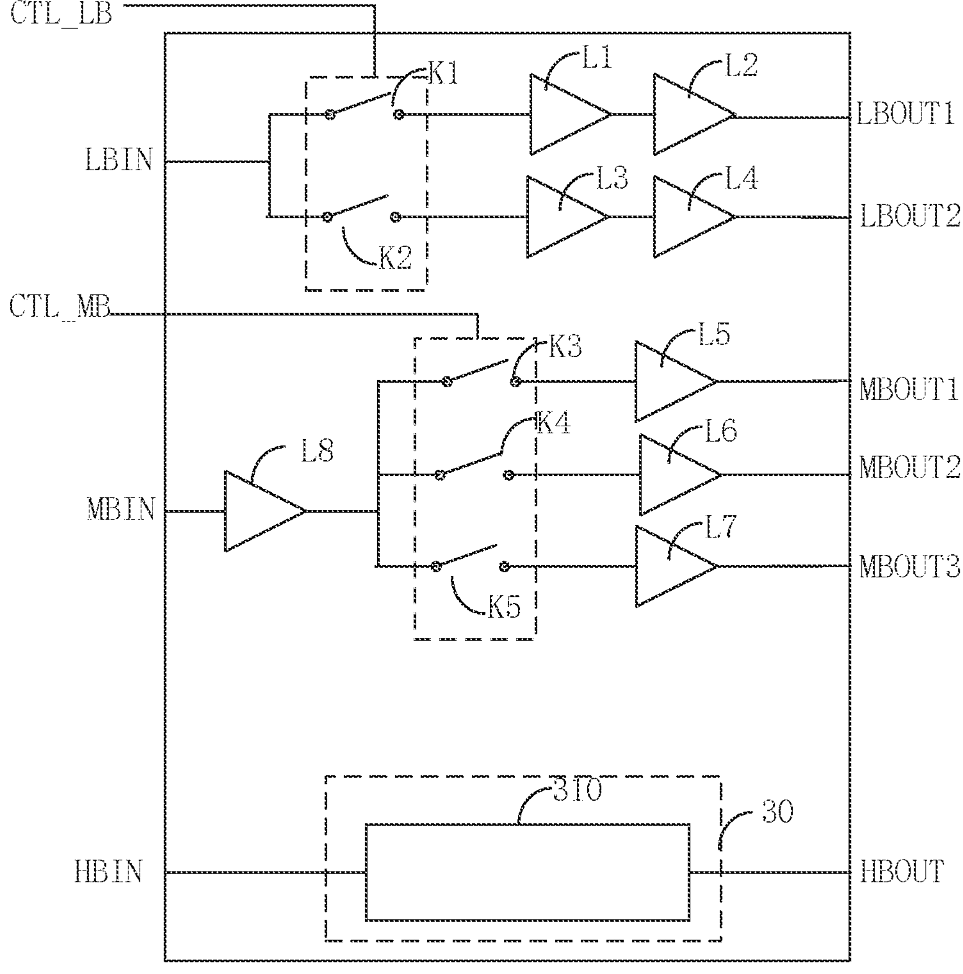
FIG. 8 is a seventh schematic structural diagram of an RF front-end chip according to some embodiments of the present disclosure.

As a possible embodiment, referring to FIG. 8, the third branched amplifier 2310 may include a fifth amplifier L5, the fourth branched amplifier 2320 may include a sixth amplifier L6, the fifth branched amplifier 2330 may include a seventh amplifier L7, and the first-stage amplification unit 210 may include an eighth amplifier L8.

Figure 9:
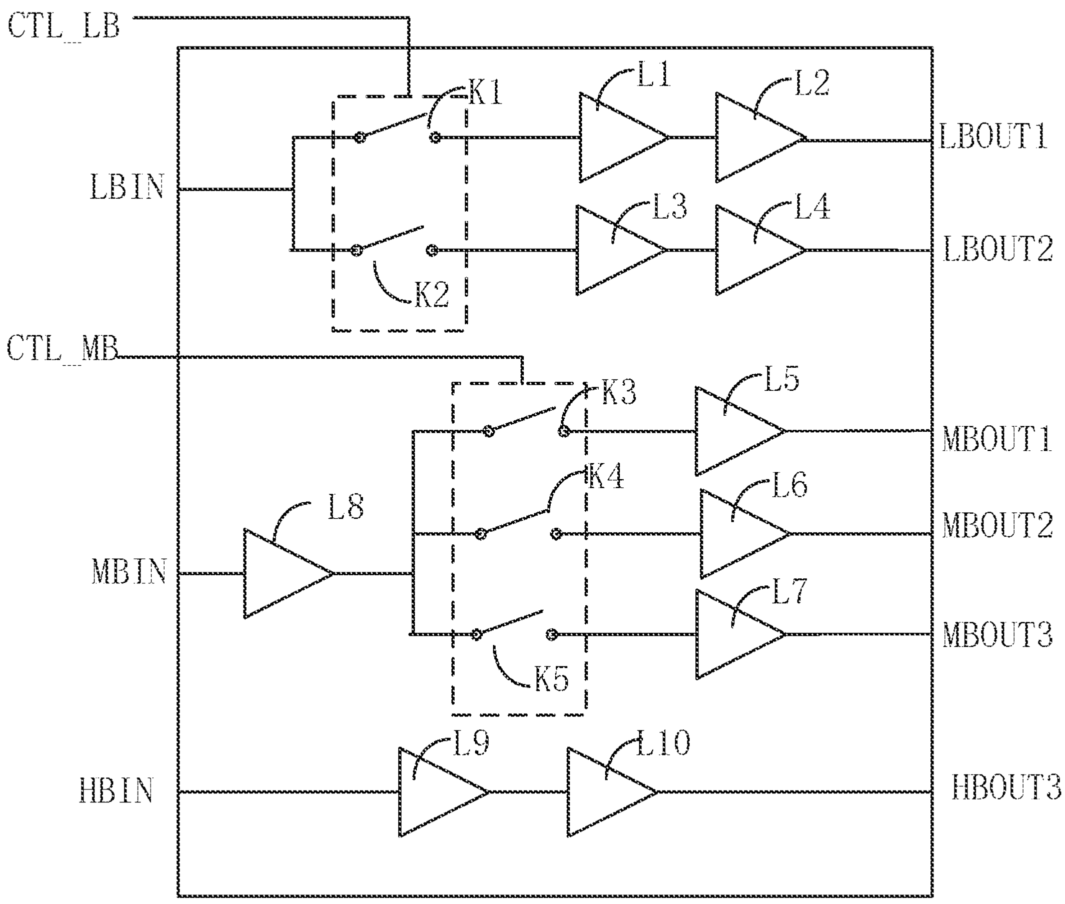
FIG. 9 is an eighth schematic structural diagram of an RF front-end chip according to some embodiments of the present disclosure.

In an optional example of this embodiment, referring to FIG. 9, the second amplifier unit 310 includes a ninth amplifier L9 and a tenth amplifier L10. The ninth amplifier L9 has an input terminal configured to receive the high-frequency band RF signal HBIN, and an output terminal electrically connected to the input terminal of the tenth amplifier L10, with the output terminal of the tenth amplifier L10 being configured to output the amplified high-frequency band RF signal HBOUT.

In an optional example of this embodiment, the first switch K1, the second switch K2, the third switch K3, the fourth switch K4, and the fifth switch K5 described previously are all controllable switches, such as field-effect tubes or controllable switches in other forms, and the selection of the specific switching devices may be adaptively adjusted according to the actual application scenario.

In an optional example of this embodiment, the amplifiers adopted in the first amplifier L1 to the tenth amplifier L10 described previously may be any one of the amplifiers that are currently available, as long as amplification of the RF signal can be realized, and the selection of specific models may be adaptively adjusted according to the actual application scenario.

As a possible embodiment, the RF front-end chip is a CMOS integrated chip.

As a possible embodiment, the RF front-end chip is packaged by a FC-LGA flip-chip process, and namely can be connected to the integrated circuit die via a copper post.

In the description of this specification, the description with reference to terms such as "some possible embodiments", "some embodiments", "examples", "specific examples", or "some examples", and the like indicates that the specific feature, structure, material or characteristic described in conjunction with the embodiment or example is included in at least one embodiment or example of the present disclosure. In this specification, the schematic representations of the aforesaid terms do not necessarily for the same embodiment or example. Moreover, the specific features, structures, materials or characteristics as described may be combined in any one or more embodiments or examples in a suitable manner. In addition, those skilled in the art may combine and group the different embodiments or examples and the features of the different embodiments or examples described in this specification without contradicting each other.

Based on the same technical concept, embodiments of the present disclosure further provide a circuit structure including the RF front-end chip according to aforesaid embodiments.

Based on the same technical concept, embodiments of the present disclosure further provide an RF communication device including the RF front-end chip according to aforesaid embodiments.

It should be noted that the circuit structure and RF communication device in embodiments of the present disclosure can realize the same effect and function with the RF front-end chip according to aforesaid embodiments, and will not be repeated herein.

On the other hand, in the existing RF path, the RF switch module is usually connected to the output terminal of the RF front-end module and located downstream of the RF front-end module. Since the existing RF front-end module includes the amplification circuit module, the RF front-end module has a rather high output power (e.g., 23 dBm or more), such that the RF switch module has to withstand the RF signal of such or even higher power level. In addition, the higher the power of the RF signal, the higher the voltage swing. Thus, for the RF switch module, this means that the voltage resistance of the electronic elements as adopted have to meet a rather high standard.

Considering reliability requirements of the operations, modules of the existing RF front-end based on the pure CMOS process often require complex design with a large footprint. In addition, the CMOS process combined with gallium arsenide (GaAs) process may require at least two layers of substrates for manufacturing, which leads to large area and volume as well as extremely high manufacturing cost of the chip.

The present disclosure proposes an RF switch module based on a CMOS process, especially based on an SOI process. The RF switch module is capable of overcoming the problems in the prior art.

The specific embodiments of the present disclosure will be further illustrated in detail in conjunction with the accompanying drawings hereinafter.

Figure 10:
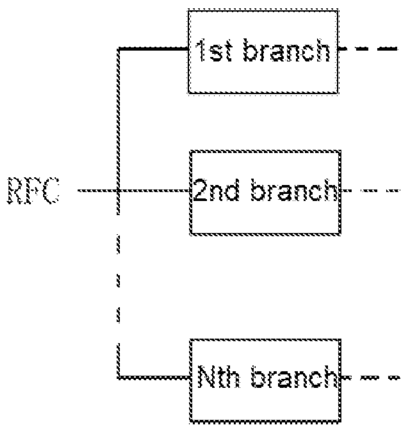
FIG. 10 is a schematic block diagram of an RF switch module according to some embodiments of the present disclosure.

FIG. 10 is a schematic block diagram of an RF switch module according to the present disclosure. This embodiment may be applicable to on-off control in an RF front-end path, especially for a low-frequency signal, a mid-frequency signal, and a high-frequency signal for 5G communications. This embodiment may be provided in the RF front-end chip.

In FIG. 10, the RF switch module includes a plurality of branches, each of which may include a switch assembly (not shown) and an amplifier (not shown). The specific embodiments of the switch assembly and the amplifier will be described below. For example, the RF switch module may include a first branch, a second branch, . . . an $N^{th}$ branch, the connection and disconnection of each branch being controlled by the logic control signal RFC. Each switch assembly may include a series circuit and a parallel circuit, both of which are circuit structures as required for the design and package. Exemplarily, the switch assembly includes a series circuit equivalent to a first assembly and a parallel circuit equivalent to a second assembly. The series and parallel circuits will be described separately below.

Figure 11:
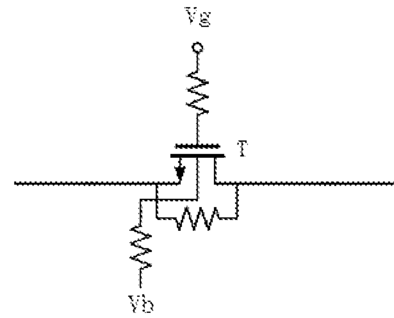
FIG. 11 is an equivalent circuit diagram of a series circuit of a switch assembly according to some embodiments of the present disclosure.

FIG. 11 is an equivalent circuit diagram of a series circuit of a switch assembly according to some embodiments of the present disclosure. As shown in FIG. 11, the series circuit includes a transistor T. The source and drain of the transistor T are connected via a resistor, the gate of the transistor T receives a logic control signal Vg via a resistor, and the substrate of the transistor T receives a body voltage Vb via a resistor.

In some embodiments, the series circuit of the switch assembly may be composed of a plurality of transistor circuits, and the plurality of transistor circuits have a series stack structure (also referred to as a "series circuit") based on the stack structure of the SOI process. The series circuit may be equivalent to the assembly shown in FIG. 11. In some embodiments, the sources and drains of the plurality of transistors in the series circuit are connected to each other.

Figure 12:
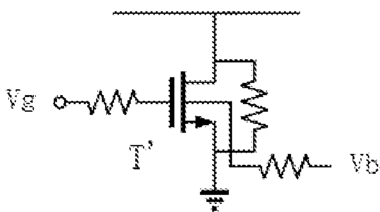
FIG. 12 is an equivalent circuit diagram of a parallel circuit of a switch assembly according to some embodiments of the present disclosure.

FIG. 12 is an equivalent circuit diagram of a parallel circuit of a switch assembly according to some embodiments of the present disclosure. As shown in FIG. 12, the parallel circuit may include a field-effect tube T'. The source and the drain of the field-effect tube T' are connected via a resistor, the gate of the field-effect tube T' receives a bias voltage Vg via a resistor, and the substrate of the field-effect tube T' receives a body voltage Vb via a resistor.

In some embodiments, the parallel circuit of the switch assembly may include a plurality of field-effect tube circuits, and the plurality of field-effect tube circuits have a parallel stacked structure (also referred to as a "parallel circuit") based on the stack structure of the SOI process. The parallel circuit may be equivalent to the assembly shown in FIG. 12. In some embodiments, the gates of the plurality of field-effect tubes each receive a bias voltage Vg via a plurality of resistors respectively, and the substrates of the plurality of field-effect tubes each receive a body voltage Vb via a plurality of resistors respectively.

Figure 13:
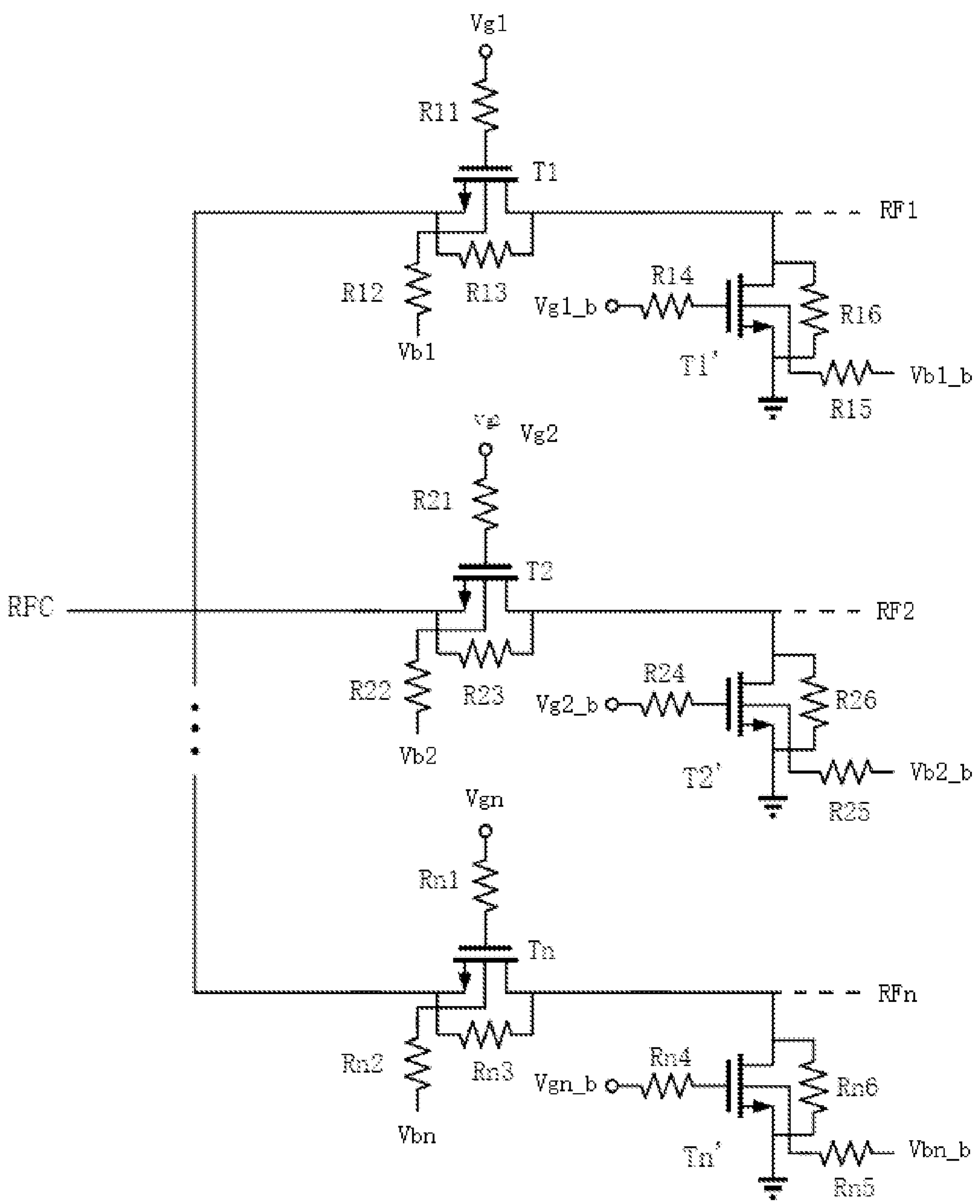
FIG. 13 is an equivalent circuit diagram of an RF switch module according to some embodiments of the present disclosure.

FIG. 13 is an equivalent circuit diagram of an RF switch module according to some embodiments of the present disclosure. This embodiment may be applicable to on-off control in an RF front-end path, especially for a low-frequency signal, a mid-frequency signal, and a high-frequency signal for 5G communications. This embodiment may be provided in the RF front-end module 105 as shown in FIG. 1.

In FIG. 13, the RF switch module includes a plurality of branches, each branch including the switch as shown in FIG. 11 and the amplifier as shown in FIG. 12.

Since each branch is provided with the same circuit arrangement, the switch assembly is described below by taking only the first branch as an example.

The logic control signal RFC is input to the control terminal of the switch assembly to connect or disconnect the branch in which the switch assembly is located. Since the series circuit of the switch assembly is composed of a plurality of rather complex transistor circuits, the complex series circuit is equivalent in the present disclosure to including a series transistor T1, a first resistor R11, a second resistor R12, and a third resistor R13. In some embodiments, the control terminal of the switch assembly may be the source of the series transistor T1. A bias voltage Vg1 is input to the gate of the series transistor T1 via the first resistor R11, a first body voltage Vb1 is input to the substrate of the series transistor T1 via the second resistor R12, and the third resistor R13 is provided between the source and the drain of the series transistor T1.

The first resistor R11 may be a bias resistor. The bias resistor can be designed to have as large a resistance value as possible while ensuring the switching speed, so as to ensure that the transistor T1 will not be turned on when a high power impact is applied to the series transistor T1. In some embodiments, the switching speed refers to the speed of switching between frequency bands, such as the switching from 3G to 4G or the switching from 4G to 5G. In some embodiments, the branches may be applicable to different RF signals respectively. In some embodiments, the scenario requiring the switching may be a scenario where the transmitter has to quickly access 5G from 4G when a 5G signal is suddenly found. At this point, the switch on the branch for 5G is turned on, and the switch on the branch for 4G is turned off. Since a current impacting (change from a small current to a large current) may occur during the switching and the switch on the branch for 4G needs to be turned off at this point, a large bias resistor is required to prevent the switch on the branch for 4G from being turned on again.

The first body voltage Vb1 is configured to control a threshold voltage Vt of the series transistor T1, and the voltage of the logic control signal Vg1 is required to exceed the threshold voltage Vt to connect the source and drain of the series transistor T1. A differential voltage may be formed between the first body voltage Vb1 and the logic control signal Vg1 to control the series transistor T1 to be turned on or off more accurately. Since the parallel circuit may be composed of a plurality of rather complex field-effect tube circuits, the complex parallel circuit is equivalent in the present disclosure to including a parallel field-effect tube T1', a fourth resistor R14, a fifth resistor R15, and a sixth resistor R16.

A bias voltage Vg1_*b* is input to the gate of the parallel field-effect tube T1' via the fourth resistor R14, a second body voltage Vb1_*b* is input to the substrate of the parallel field-effect tube T1' via the fifth resistor R15, and the sixth resistor R16 is provided between the source and the drain of the parallel field-effect tube T1'.

The second body voltage Vb1_*b* is configured to control the threshold voltage Vt_b of the parallel field-effect tube T1', and the bias voltage Vg1_*b* is required to exceed the threshold voltage Vt_b to connect the source and drain of the parallel field-effect tube T1'. A differential voltage may be formed between the second body voltage Vb1_*b* and the bias voltage Vg1_*b* to control the parallel transistor T1' to be turned on or off more accurately.

The output of the first branch may be an RF output signal RF1.

In some embodiments, the switch may be composed of a plurality of exactly the same transistor circuits or a plurality of different transistor circuits; and the amplifier may be composed of a plurality of exactly the same field-effect tube circuits or a plurality of different field-effect tube circuits.

Figure 14:
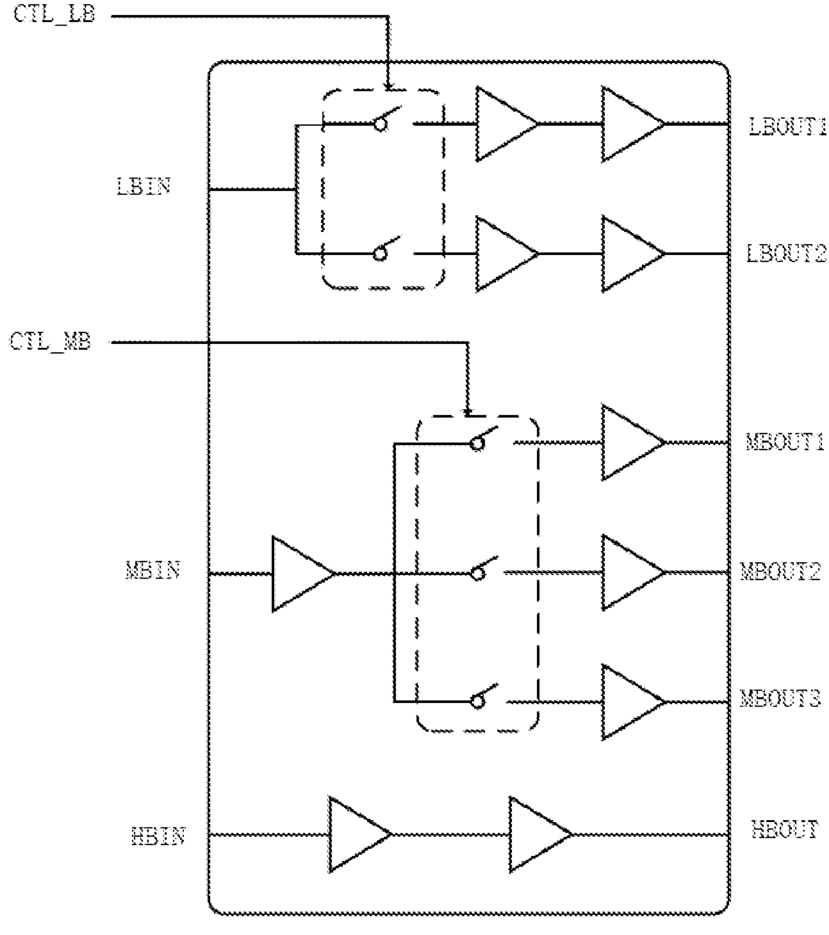
FIG. 14 is a schematic circuit design diagram of an RF front-end chip according to some embodiments of the present disclosure.

FIG. 14 is a schematic circuit design diagram of an RF front-end chip according to some embodiments of the present disclosure. One RF switch module in the RF front-end chip includes two branches. The RF switch module is controlled by a control signal CTL_LB for processing the low-frequency signal LBIN received from the terminal, and the output signals of the two branches are signals LBOUT1 and LBOUT2, respectively. Another RF switch module in the RF front-end chip includes three branches. The RF switch module is controlled by the control signal CTL_MB for processing the mid-frequency signal MBIN received from the terminal, and the output signals of the three branches are signals MBOUT1, MBOUT2, MBOUT3, respectively.

Figure 15:
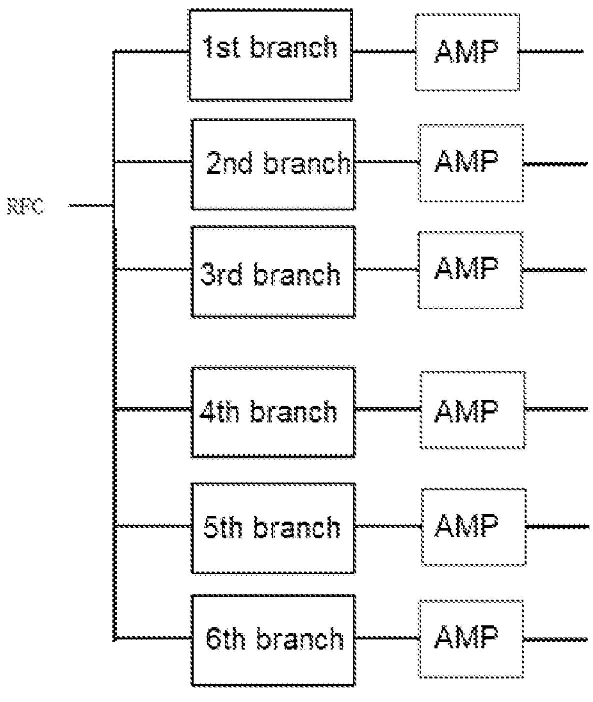
FIG. 15 is a schematic block diagram of an RF switch module according to some embodiments of the present disclosure.

FIG. 15 is a schematic block diagram of an RF switch module according to some embodiments of the present disclosure. The RF switch module includes six branches, each of which is connected to an amplifier at the downstream thereof. A power amplifier module may be provided downstream of the RF switch module.

Figure 16:
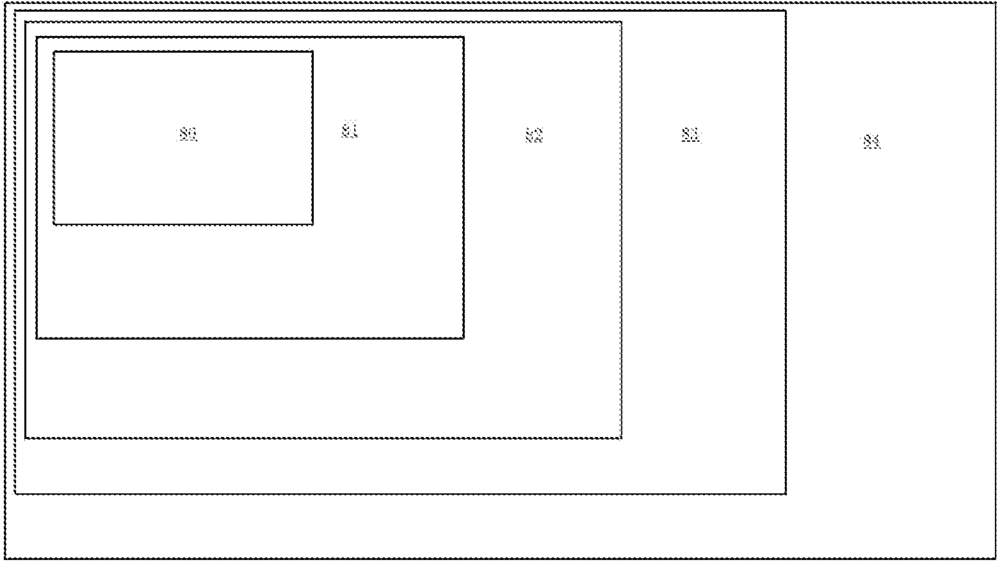
FIG. 16 is a schematic block diagram of various apparatuses including an RF switch module according to some embodiments of the present disclosure.

FIG. 16 is a schematic block diagram of various apparatuses including the RF switch module according to some embodiments of the present disclosure. As shown in FIG. 16, the RF switch module 80 may be included in an RF front-end chip 81, the RF front-end chip 81 may be included in a transmitter 82, the transmitter 82 may be included in a transceiver 83, and the transceiver 83 may be included in a signal processing device 84.

The circuit structure presented in the present disclosure may be referred to as a single pole x throw structure. The circuit structure allows the input RF signal to be input into a plurality of branches. In some embodiments, the circuit structure of the RF switch module may as shown in FIG. 15 typically include two branches (i.e., a "single pole two throw" structure), three branches (i.e., a "single pole three throw" structure), or six branches (i.e., a "single pole six throw" structure).

In some embodiments, a power amplifier module may be provided downstream of various RF switch modules according to the present disclosure. In some embodiments, the power amplifier module may include one or more power amplifiers (in particular, field-effect tubes).

The RF switch module according to embodiments of the present disclosure may be integrated within an RF front-end module/RF front-end chip.

In the present disclosure, while packaging the RF switch module in practice, the RF switch module may include switches having a series stack structure of transistors. In order to minimize the on-resistance, reduce impedance and increase the current flowing through the switch, the switch is therefore designed to adopt a large-size transistor if allowed for the area of chip; on the other hand, the RF switch module further includes a parallel stack structure of field-effect tubes. The parallel stack structure is provided to achieve the minimum turn-off capacitance and a high power carrying capacity in the turn-off mode. In summary, those skilled in the art may flexibly select the number of transistors/field-effect tubes to be stacked in accordance with the present disclosure to achieve optimal performance.

The advantage of the present disclosure over the prior art lies in that the RF switch module and the power amplifier module in the present disclosure can not only be integrated onto a substrate due to the SOI process as adopted, but also overcome the technical prejudice that the RF switch module according to the prior art can only be formed into a single chip (i.e., the RF switch module according to the prior art is fabricated on a separate substrate to maintain a certain distance between the RF switch module and the chip of the power amplifier module, so as to minimize mutual interference). Thus, based on the structure and design, the solution of the present disclosure can not only improve the integration level of the chip/substrate, but also ensure the performance of the chip/substrate as acquired.

Figure 17:
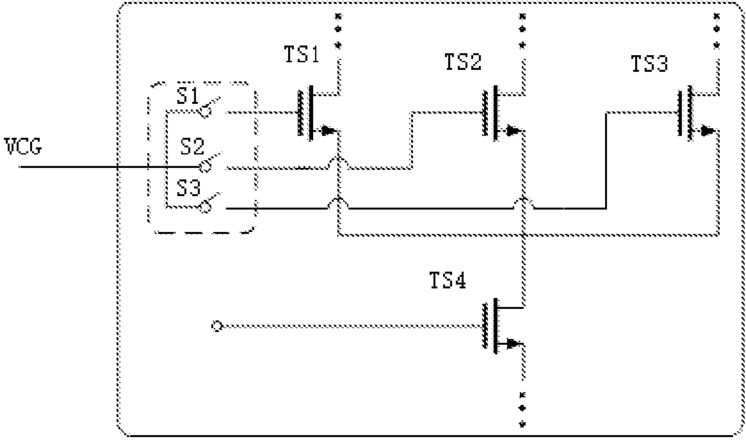
FIG. 17 is a schematic circuit diagram of an RF switch module according to some embodiments of the present disclosure.

In another aspect, FIG. 17 is a schematic circuit diagram of an RF switch module according to some embodiments of the present disclosure. This embodiment may be applicable to the RF signal in the RF front-end path, in particular the mid-frequency signal, especially the mid-frequency signal targeted for 5G communications. This embodiment may be provided in the RF front-end chip.

In FIG. 17, the logic control signal (an output signal from a logic control module not shown) is input to a switch module composed of three branches provided in parallel. The three branches are provided with three switches S1, S2, and S3, respectively. In some embodiments, the switches may be transistors. The on and off of the three switches S1, S2 and S3 is controlled by the logic control signal.

In some embodiments, the switch S1 is connected to a gate of the field-effect tube TS1, the switch S2 is connected to a gate of the field-effect tube TS2, and the switch S3 is connected to a gate of the field-effect tube TS3. The gates of the field-effect tubes TS1, TS2, and TS3 herein may serve as the control terminals of the field-effect tubes TS1, TS2, and TS3. The sources of the field-effect tubes TS1, TS2, and TS3 are connected to the drain of the field-effect tube TS4. The sources of the field-effect tubes TS1, TS2, and TS3 herein may serve as signal input terminals of the field-effect tubes TS1, TS2, and TS3; and the drain of the field-effect tube TS4 may serve as a signal output terminal of the field-effect tube TS4. The gate of the field-effect tube TS4 may serve as a signal input terminal of the field-effect tube TS4 for receiving the RF signal, in particular the mid-frequency signal. The signal VCG in FIG. 17 controls the corresponding one of the field-effect tubes TS1, TS2, and TS3 via any of the circuits as turned on by the switches S1, S2, and S3. The field-effect tubes TS1, TS2, TS3 and TS4 may serve as amplifiers provided downstream of the switch module. The arrangement of the field-effect tubes may be changed in a manner known in the art to meet different needs. The amplifier and the antenna in the RF path may serve as a load for the switch module.

Figure 18:
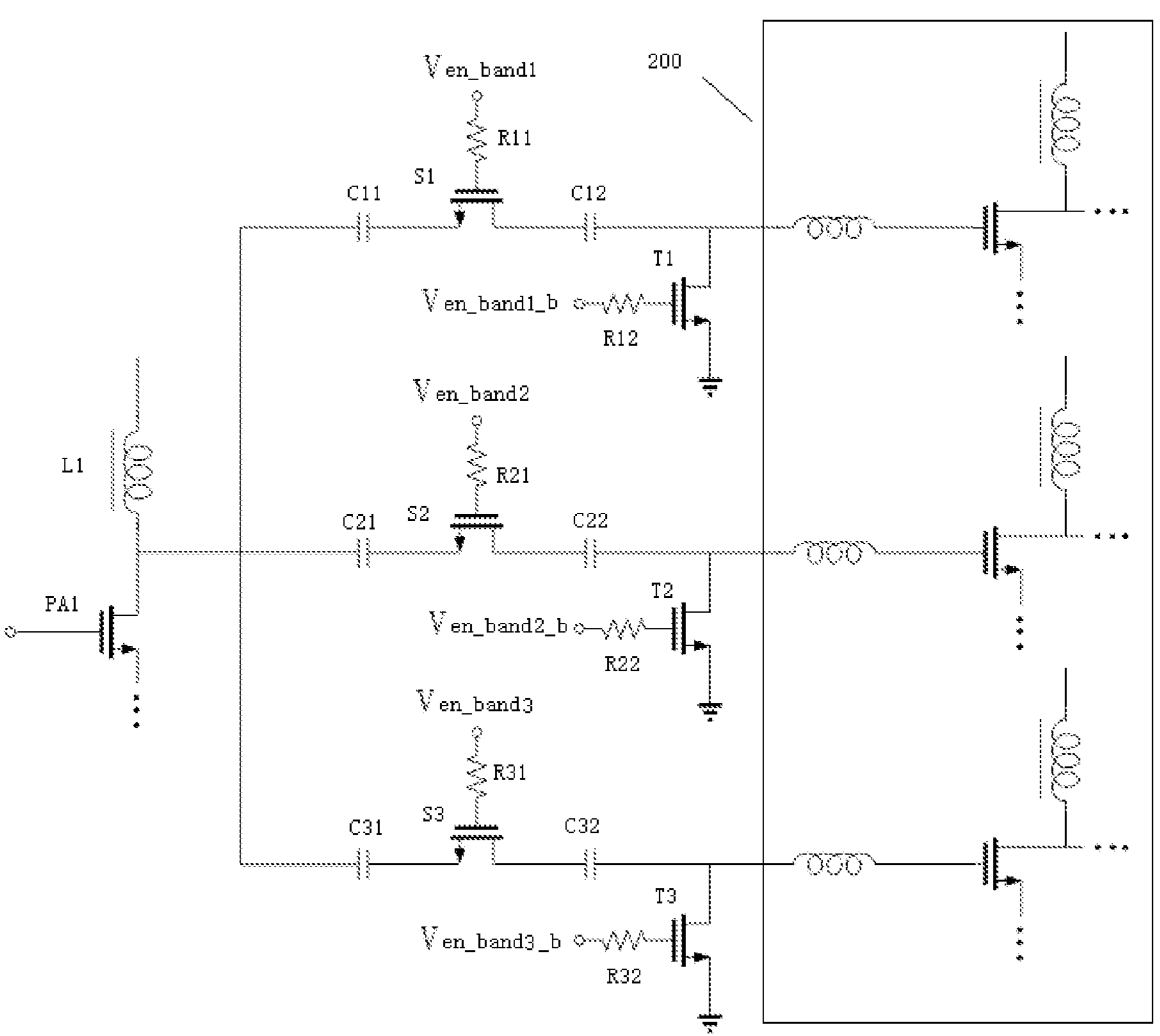
FIG. 18 is a schematic circuit diagram of an RF switch module according to some embodiments of the present disclosure.

FIG. 18 is a schematic circuit diagram of an RF switch module according to another embodiment of the present disclosure. This embodiment may be applicable to the RF signal in the RF front-end path, in particular the mid-frequency signal, especially the mid-frequency signal for 5G communications. This embodiment may be provided in the RF front-end module 105 as shown in FIG. 1.

In this embodiment, the block 200 refers to a second-stage amplifier provided downstream of the switch module. In some embodiments, the second-stage amplifier 200 may be connected to a matching network, in particular an impedance matching network. In some embodiments, the matching network may be connected to an antenna in the RF path. The matching network and the antenna may be considered as loads.

In this embodiment, the first-stage amplifier is composed of a power amplifier PA1 and an inductor L1. The RF signal, in particular the mid-frequency signal, from the first-stage amplifier is input to the switch module that is composed of three branches provided in parallel. Since each of the three branches is provided with the same circuit arrangement, the switch module will be described below by taking only the first branch as an example.

The first branch may include a switch that connects or disconnects the first branch based on a received control signal. In some embodiments, the switch may be a switching transistor S1, and the first branch may further include a resistor R11, a capacitor C11, and a capacitor C12. The source of the switching transistor S1 is connected to a terminal of the capacitor C11, and the other terminal of the capacitor C11 receives a signal from the first-stage amplifier. The drain of the switching transistor S1 is connected to a terminal of the capacitor C12, and the other terminal of the capacitor C12 is connected to an input terminal of the second-stage amplifier 200. The gate of the switching transistor S1 is connected to a terminal of the resistor R11, and the other terminal of the resistor R11 receives the logic control signal $V_{en\_band1}$.

In some embodiments, a break unit may be further provided in the first branch, and the break unit includes a pull-down transistor T1 and a resistor R12. The gate of the pull-down transistor T1 is connected to a terminal of the resistor R12, and the other terminal of the resistor R12 receives a pull-down control signal $V_{en\_band1}\_b$. The drain of the pull-down transistor T1 is connected to the other terminal of the capacitor C12. The source of the pull-down transistor T1 is grounded. In some embodiments, the break unit may also be provided in each branch of the switch module as shown in FIG. 17.

In some embodiments, the pull-down control signal $V_{en\_band1}\_b$ causes the pull-down transistor T1 to be turned off when the logic control signal $V_{en\_band1}$ causes the switch transistor S1 to be turned on; and the pull-down control signal $V_{en\_band1}\_b$ causes the pull-down transistor T1 to be turned on when the logic control signal $V_{en\_band1}$ causes the switch transistor S1 to be turned off. The switching transistor S1 being turned on means that the first branch is connected, and the switching transistor S1 being turned off means that the first branch is disconnected.

In some embodiments, any of the three branches may be connected or disconnected according to the needs in controlling the mid-frequency signal.

The switch module according to embodiments of the present disclosure may be integrated within the RF front-end module. For example, the switch module may be provided upstream of an amplifier within the RF front-end module or between the first-stage and second-stage amplifiers, which is the location where the voltage swing is small. As a result, this configuration requires less power-carrying capacity for the switch module, such that the switch capable of carrying smaller power values/voltage values can be adopted to reduce losses in each branch and to enhance isolation between branches (i.e., to reduce interference between branches).

The parasitic impedance as introduced by turning off the switching transistor in the connected branch can be absorbed by the matching network, which reduces the effect of the parasitic impedance. If a leaked signal exists in the disconnected path, the leaked signal may be pulled down to ground via the pull-down transistor, thereby preventing the leaked signal from driving the amplifier at the downstream.

The respective embodiments of the present disclosure are described in a progressive manner. The reference may be made to each other for the same or similar parts of the respective embodiments, and each embodiment focuses on the differences from other embodiments. Especially, for the embodiments of the apparatus, device and computer-readable storage medium, since they basically correspond to the embodiments of the method, they are described in a simple way, and reference may be made to the description part on embodiments of the method for relevant points.

Although the spirit and principles of the present disclosure have been described with reference to several embodiments, it shall be understood that the present disclosure is not limited to the embodiments as disclosed, nor does the division of the aspects imply that the features in those aspects cannot be combined for benefit, such division being for convenience of presentation only. The present disclosure is intended to cover various modifications and equivalent arrangements included within the spirit and scope of the appended claims.

What is claimed is:

1. An RF front-end chip, comprising a logic control circuit, a switching circuit and an amplifier module assembly that are integrated onto an integrated circuit die, wherein the logic control circuit is connected to the switching circuit and configured to control the switching circuit, and the switching circuit is integrated into the amplifier module assembly and precedes one or more amplifiers of the amplifier module assembly, wherein the amplifier module assembly comprises a low-frequency amplification module, a mid-frequency amplification module and a high-frequency amplification module, wherein the low-frequency amplification module comprises a first switch unit and a first amplifier unit, with the first switch unit preceding the first amplifier unit; the mid-frequency amplification module comprises a first-stage amplification unit, a second switch unit and a second-stage amplification unit, with the second switch unit being provided between the first-stage amplification unit and the second-stage amplification unit; and the high-frequency amplification module comprises a second amplifier unit, wherein the first switch unit comprises a first switch and a second switch, the first amplifier unit comprises a first branched amplifier and a second branched amplifier, wherein the first switch and the second switch have respective input terminals each configured to receive a low-frequency band RF signal, with an output terminal of the first switch being electrically connected to the first branched amplifier and an output terminal of the second switch being electrically connected to the second branched amplifier.

2. The RF front-end chip according to claim 1, wherein the first switch unit has a first terminal configured to receive a low-frequency band RF signal, a second terminal electrically connected to an input terminal of the first amplifier unit, and a control terminal connected to the logic control circuit.

3. The RF front-end chip according to claim 1, wherein the first branched amplifier comprises a first amplifier and a second amplifier, and the second branched amplifier comprises a third amplifier and a fourth amplifier, wherein the first amplifier has an input terminal electrically connected to the output terminal of the first switch, and an output terminal electrically connected to an input terminal of the second amplifier, with an output terminal of the second amplifier being configured to output an amplified low-frequency band RF signal; and the third amplifier has an input terminal electrically connected to the output terminal of the second switch, and an output terminal electrically connected to an input terminal of the fourth amplifier, with an output terminal of the fourth amplifier being configured to output an amplified low-frequency band RF signal.

4. The RF front-end chip according to claim 1, wherein the first-stage amplification unit has an input terminal configured to receive a mid-frequency band RF signal, and an output terminal electrically connected to the second-stage amplification unit via the second switch unit, with a control terminal of the second switch unit being configured to receive a second control signal.

5. The RF front-end chip according to claim 4, wherein the second switch unit comprises a third switch, a fourth switch, and a fifth switch, and the second-stage amplification unit comprises a third branched amplifier, a fourth branched amplifier and a fifth branched amplifier, wherein the third switch, the fourth switch and the fifth switch have respective input terminals each connected to the output terminal of the first-stage amplification unit, and respective output terminals electrically connected to the third branched amplifier, the fourth branched amplifier and the fifth branched amplifier respectively.

6. The RF front-end chip according to claim 5, wherein the third branched amplifier comprises a fifth amplifier, the fourth branched amplifier comprises a sixth amplifier, the fifth branched amplifier comprises a seventh amplifier, and the first-stage amplification unit comprises an eighth amplifier.

7. The RF front-end chip according to claim 1, wherein the second amplifier unit comprises a ninth amplifier and a tenth amplifier, wherein the ninth amplifier has an input terminal configured to receive a high-frequency band RF signal, and an output terminal electrically connected to an input terminal of the tenth amplifier, with an output terminal of the tenth amplifier being configured to output an amplified high-frequency band RF signal.

8. The RF front-end chip according to claim 1, wherein the RF front-end chip is a CMOS integrated chip, and the RF front-end chip is packaged by a FC-LGA flip-chip process.

9. An RF communication device comprising the RF front-end chip according to claim 1.

10. An RF switch module configured to be applicable to the RF front-end chip according to claim 1, the RF switch module comprising at least two branches provided in parallel, each branch of the at least two branches comprising a switch assembly configured to connect or disconnect said each branch comprising the switch assembly based on a received logic control signal, wherein said each branch further comprises an amplifier provided downstream of the switch assembly.

11. The RF switch module according to claim 10, wherein the switch assembly comprises a series circuit equivalent to a first assembly comprising a series transistor, a first resistor, a second resistor and a third resistor, the series transistor having a gate configured to receive a first bias voltage input via the first resistor, and a source and a drain with the third resistor provided therebetween, wherein the drain is further connected to the amplifier.

12. The RF switch module according to claim 11, wherein the series transistor has a substrate configured to receive a first body voltage input via the second resistor.

13. The RF switch module according to claim 11, wherein the switch assembly comprises a parallel circuit equivalent to a second assembly comprising a parallel field-effect tube, a fourth resistor, a fifth resistor and a sixth resistor, the parallel field-effect tube having a gate configured to receive a second bias voltage input via the fourth resistor, and a source and a drain with the sixth resistor provided therebetween.

14. The RF switch module according to claim 13, wherein the parallel field-effect tube has a substrate configured to receive a second body voltage input via the fifth resistor.

15. An RF switch module configured to be applicable to amplification of an RF signal, the RF switch module comprising a first branch, a second branch and a third branch that are arranged in parallel, wherein each branch of the first branch, the second branch and the third branch comprises a switch configured to connect or disconnect said each branch comprising the switch based on a received logic control signal, wherein switches of the first branch, the second branch and the third branch are respectively connected to a first field-effect tube, a second field-effect tube and a third field-effect tube, where the first field-effect tube, the second field-effect tube and the third field-effect tube have respective input terminals each connected to a signal output terminal of a fourth field-effect tube, with a signal input terminal of the fourth field-effect tube being configured to receive an input RF signal, and any one field-effect tube of the first field-effect tube, the second field-effect tube and the third field-effect tube being controlled by a signal transmitted in one of the first branch, the second branch and the third branch that corresponds to said any one field-effect tube.

16. The RF switch module according to claim 15, wherein the switch is a switching transistor, said each branch is configured to receive the logic control signal via a control terminal of the switching transistor, and the RF switch module receives an output signal from an output terminal of a first-stage amplifier provided upstream of the RF switch module, and inputs the received output signal to an input terminal of a second-stage amplifier provided downstream of the RF switch module based on the logic control signal.

17. The RF switch module according to claim 16, wherein said each branch is configured such that the control terminal of the switching transistor receives the logic control signal input via a first resistor, a first signal terminal of the switching transistor receives the output signal input via a first capacitor, and a second signal terminal of the switching transistor transmits the received output signal via a second capacitor.

18. The RF switch module according to claim 15, wherein said each branch further comprises a break unit that enables breaking of said each branch comprising the break unit, the break unit comprising a pull-down transistor that enables grounding or ungrounding of said each branch comprising the break unit based on a pull-down control signal as received.

19. The RF switch module according to claim 18, wherein the pull-down transistor has a control terminal configured to receive the pull-down control signal input via a second resistor, a first signal terminal that is grounded, and a second signal terminal connected to an input terminal of a second-stage amplifier.

* * * * *